United States Patent
Aliganga et al.

(10) Patent No.: US 12,213,250 B2
(45) Date of Patent: Jan. 28, 2025

(54) CONDUCTIVE INK INTERCONNECTED DEVICES

(71) Applicant: NCR Voyix Corporation, Atlanta, GA (US)

(72) Inventors: John Paul Bacalso Aliganga, Cebu (PH); Jason Delos Angeles, Cebu (PH); Jan Angielee Alpuerto Gesite, Tagbilaran (PH); Teofrenz Aralquez Ycot, Mandaue (PH)

(73) Assignee: NCR Voyix Corporation, Atlanta, GA (US)

( * ) Notice: Subject to any disclaimer, the term of this patent is extended or adjusted under 35 U.S.C. 154(b) by 241 days.

(21) Appl. No.: 17/900,003

(22) Filed: Aug. 31, 2022

(65) Prior Publication Data

US 2024/0074045 A1 Feb. 29, 2024

(51) Int. Cl.
*H05K 1/09* (2006.01)
*H05K 1/11* (2006.01)
*H05K 1/14* (2006.01)
*H05K 1/18* (2006.01)
*H05K 3/12* (2006.01)

(52) U.S. Cl.
CPC .............. *H05K 1/092* (2013.01); *H05K 1/111* (2013.01); *H05K 1/141* (2013.01); *H05K 1/181* (2013.01); *H05K 3/12* (2013.01); *H05K 2201/049* (2013.01); *H05K 2201/10128* (2013.01)

(58) Field of Classification Search
CPC ........ H05K 1/092; H05K 1/111; H05K 1/141; H05K 3/12; H05K 1/097
See application file for complete search history.

(56) References Cited

U.S. PATENT DOCUMENTS

| | | | |
|---|---|---|---|
| 2013/0161083 A1* | 6/2013 | Malstrom | H05K 3/4664 174/250 |
| 2017/0246898 A1* | 8/2017 | Stone | B42D 15/045 |
| 2018/0242451 A1* | 8/2018 | Chopra | H01L 24/32 |
| 2021/0193686 A1* | 6/2021 | You | G02F 1/136286 |

* cited by examiner

*Primary Examiner* — Sherman Ng
(74) *Attorney, Agent, or Firm* — Schwegman Lundberg & Woessner, P.A.

(57) ABSTRACT

A host device includes surface mount conductive pads on a printed circuit board (PCB) for external peripheral communications. Conductive ink is printed on the conductive pads with a base member is printed over the conductive ink. Three-dimensional (3D) conductive wires are printed on the base member and extend along a housing to a new external port. Conductive ink is printed with a second base member and terminating ends of the wires are printed on the front of the base member establishing the new peripheral port for the host device. A peripheral device includes its own surface mount conductive pads which when aligned and brought into contact with the external port of the host device permits the host device and the peripheral device to establish a wired connection with one another without cables, without cable harnesses, and without port connectors.

20 Claims, 11 Drawing Sheets

CONDUCTIVE INK INTERCONNECTED DEVICES

BACKGROUND

Cable management is an essential part of every design which involves an assembly. This creates a neat and safe layout of components. Designers are always drawn to purchase and include cable guides in the assembly. Enterprises that need to configure and interface host devices, such as transaction terminals, with peripheral devices typically purchase significant amounts of cable guides, which add to the overall costs of the host devices and their corresponding peripheral devices. Additionally, cables and/or cable harnesses require connectors for the cable side and the printed circuit boards (PCBs) of the host and peripheral devices.

From a practical standpoint, the usual lead time is 5-8 weeks when purchasing necessary cables, cable harnesses, and connectors. This creates further delays in manufacturing and/or setup time for the host systems.

When cable management is overlooked, the components are difficult to service, which takes more assembly time on site of the enterprises. Further, the chassis or device housing may also not be able to accommodate the physical requirements because of a need to include internal cables.

Thus, hosts systems from manufacture to operational status on site at enterprises incur substantial delays and time delays, which must be planned for and budgeted by the enterprises.

SUMMARY

In various embodiments, conductive ink interconnected devices and a method of manufacture are provided. As will be demonstrated herein and below, a device is provided with prefabricated nanoparticle conductive ink wires that are three-dimensional (3D) printed on an outer housing channel and connected on one end to a PCB of a host device to PCB surface mount conductive pads in place of a traditional external peripheral port connection. The printed conductive wires extend from the conductive pads of the host PCB along the housing to a desired external port location on the housing. A spring-based bridge base member is printed under the wires at the external port location, the wires and base member at the location provide a new wired external port for the device. A peripheral device with a PCB surface mount conductive pad is aligned to the base member with the wires and brought into contact with one another establishing an external peripheral device connection between the peripheral device and the host device. This connection is maintained without cables, without cable harnesses, and without port connectors.

According to an aspect, a device is provided. The device includes a PCB, surface mount conductive pads surface on the PCB in a location associated with external peripheral communications for an external peripheral to the device, and three-dimensional (3D) nanoparticle ink wires printed from the conductive pads along a housing of the device to a terminating location on the housing. The 3D nanoparticle ink wires associated with the terminating location adapted when pressed against peripheral conductive pads for the external peripheral to establish a wired connection between the device and the external peripheral without any cable, without any cable harness, and without any port connector.

with conductive ink wires 3D printed from a first location associated with external peripheral port pin connection on a PCB of the device to a second location. The second location includes 3D conductive pads printed on a terminating end the 3D printed wires that serve as an external port connection for the device. A peripheral device with its own 3D conductive pads is brought into contact with the device's pads to establish a wired connection between the device and the peripheral device without any cable, without any cable harness, and without any port connector.

DETAILED DESCRIPTION

As stated above, cable management and physical space limitations add significant time and expense when setting up a host device with connected peripheral devices. Often different sized cords and cord connectors are needed to accommodate the needed configuration on site of the host system. Setup can be delayed if all parts are not carefully planned for delivery and assembled correctly by technicians on site.

The teachings that follow provide an approach by which an original manufacture of a device can include device modifications, or the device modifications can include the modifications made post original manufacture. The modifications can include removal of existing peripheral port connections on the device's PCB with a surface mount conductive pad along with 3D printed wires that extends from the PCB surface mount pads to desired locations along a housing for the device to a new peripheral port connection. The new peripheral port connection is a 3D printed plastic bridge with conductive ink that links the 3D printed wires back to the corresponding surface mount conductive pad of the PCB. Two or more devices are interconnected by establishing contact between their respective conductive pads in place of a conventional cable and port connector.

Figure 1A:
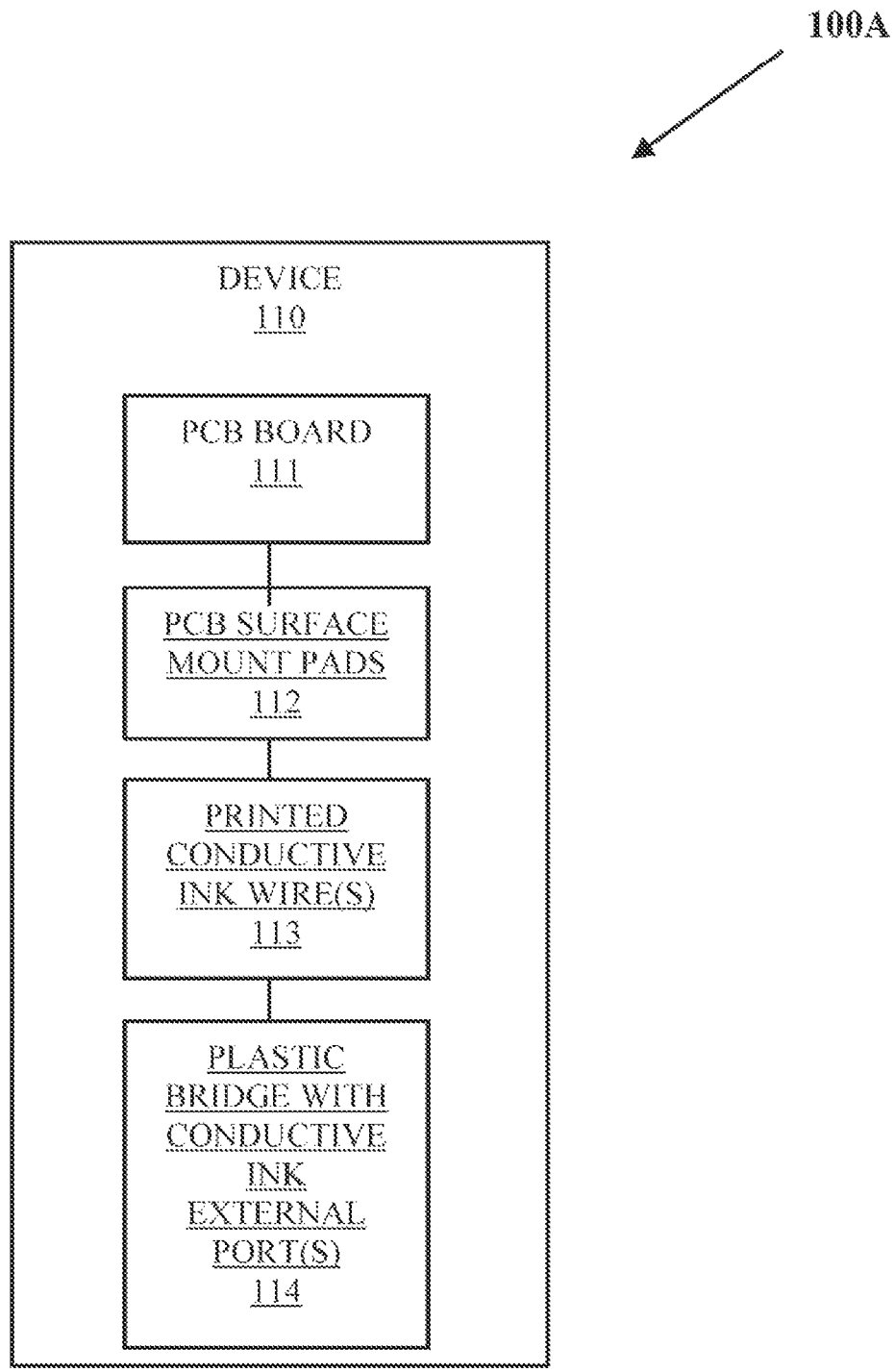
FIG. 1A is a diagram 100A of device with a surface mount conductive pad and 3D printed nanoparticle conductive wires extending to a new 3D printed conductive peripheral port connection along a housing of the device, according to an example embodiment.

FIG. 1A is a diagram 100A of device with a surface mount conductive pad and 3D printed nanoparticle conductive wires extending to a new 3D printed conductive peripheral port connection along a housing of the device, according to an example embodiment. The device 110 includes a PCB 111, PCB surface mount pads 112, 3D printed conductive ink wires 113, and one or more plastic bridges with conductive ink external ports 114.

Conventional connections between the PCB 111 and is externally interfaced peripheral port connector are removed in device 110. The PCB connections that would be wired to an existing port connector replaced with PBC surface mount conductive pads 112 that are, optionally, wired to 3D printed nanoparticle conductive wires 113 using a 3D printer. The outer housing that covers an underside or side of device 110 is also manufactured with trenches, valleys, or recesses to accommodate the 3D printed wires 113 on the outer housing in the recesses.

Each wire 113 printed corresponds to a pad 112, which is surface mount on the PCB 111 for a given peripheral port connection to the PCB 111. Each wire 113 terminates at a given location along the housing on a 3D printed plastic bridge or base that includes conductive ink and servers as a new external port 114 for device 110. A given set of pads 112 replaces a conventional external port connection on the PCB 111. A second device 110 may then be connected to the new external port 114 by placing the second device's PCB surface mount pads 112 in contact with the new external port 114 or in directed contact with PCB surface mount pads 112 of device 110. A set of wires 113, beginning at the device's PCB surface mount pads 112, are 3D printed along prefabricated recesses in an outer housing or cover of the device 110 from the PCB surface mount pads 112 to a desired physical location on the housing, and a 3D printed plastic bridge with conductive ink are printed under a second and terminating end of the set of wires 113.

Underneath each set of pads 112 on the PCB board 112 is also a plastic bridge base member is 3D printed to provide stability to the pads 112 during a connection to another device's 110 corresponding connective pads 112. The plastic bridge base member includes a spring-based action that allows for two sets of pads 112 for two devices 110 to remain in contact with one another by spring back when resting against one another in contact. The plastic base member or bridge exhibits sprint-based action to expand and contract, such that when brought into contact with another plastic base member, the two remain in contact with one another and push against one another.

The nanoparticle conductive ink is printed directly onto the device's outer housing in canals or recesses as conductive ink wires 113. This creates and embedded connection on the housing of the device 110 or the carrier of the housing from the PCB surface mount pads 112 of the PCB 111 to the external ports 114 along the housing at the desired location. When another device 110 is arranged such that their pads 112 are aligned and pressed together for contact using the corresponding spring-based plastic bridges and the devices 110 are powered on a peripheral connection is established between a host device 110 and peripheral device 110. This connection is achieved without any cables, cable harnesses, and port connectors. The peripheral device's PCB surface mount pads 112 can be placed in contact with the host at the external ports 114.

PCB surface mount pads, 112, conductive ink wires 113, and relocated external ports for connecting peripheral devices removes the need for cable/harness/connector planning and increases onsite setup time. Moreover, 3D printing is an additive process that produces little waste. Conventional cabling and connectors generate packaging waste and the cables and connectors themselves may require special treatment to be disposed of properly, such is not the case with devices 110.

Devices 110 can be manufactured with the PCB surface mount pads 112, 3D printed wires 113, and relocated external ports 114. Alternative, the PCB surface mount pads 112, 3D printed wires 113, and external ports 114 can be added post manufacture by replacing the outer housing with a plastic cover fabricated with canals or recesses for the 3D printed wires 113 and/or external ports 114; optionally, with the plastic bridge spring-action brace member underneath each of the PCB surface mount pads 112 and each of the terminating wires 113 at the external ports 114.

Figure 1B:
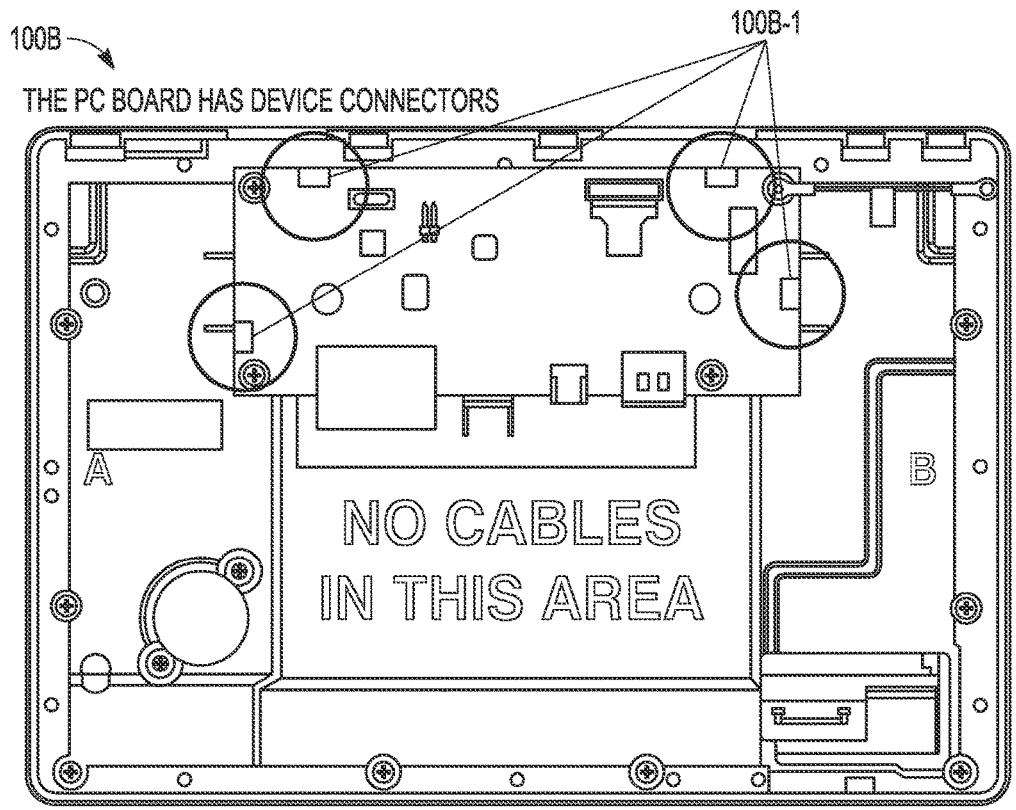
FIG. 1B is a prior art diagram of device's external ports located on a periphery of the device's PCB, according to an example embodiment.

FIG. 1B is a prior art diagram 100B of device's external ports located on a periphery of the device's PCB, according to an example embodiment. Diagram 100B illustrates 4 peripheral port connections 100B-1, which are physically located around a periphery of the device's PCB. The PCB is covered in diagram 100B, the circles indicate the location around the outer peripheral of the PCB with exposed peripheral port connections 100B-1. The device illustrated in diagram 100B is a touch display transaction terminal (hereinafter just touch display).

Figure 1C:
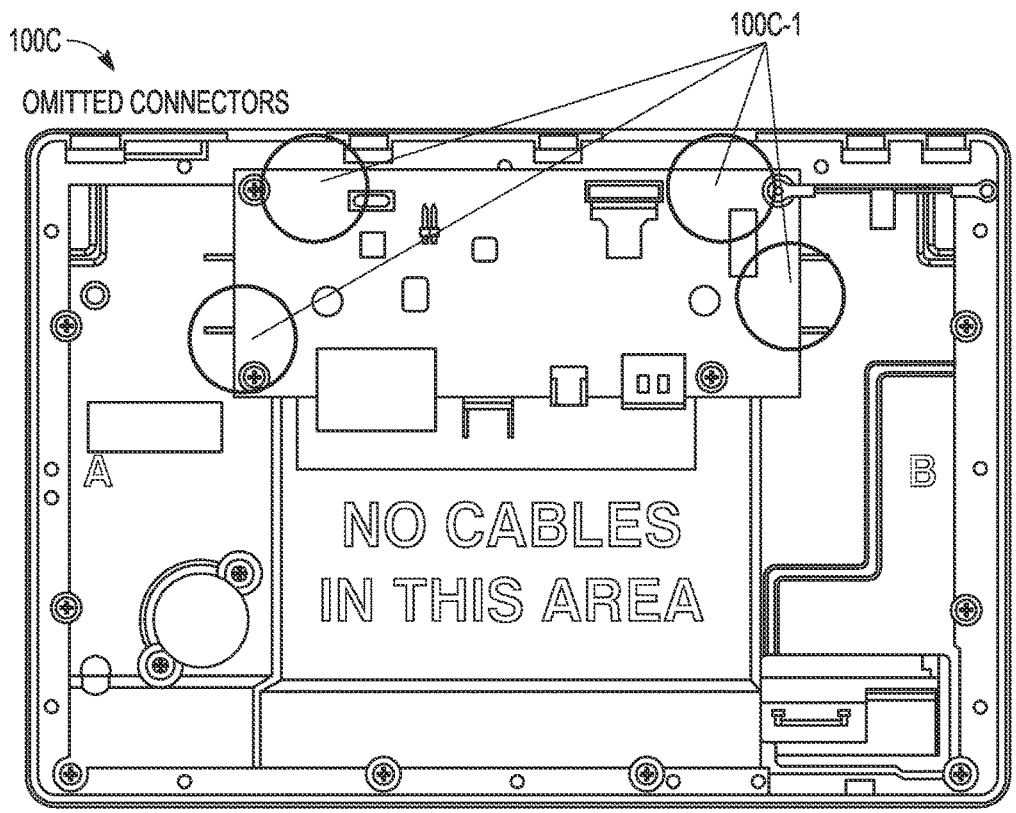
FIG. 1C is a diagram of a modified version of the device of FIG. 1B illustrating removal of the external ports along the periphery of the device's PCB, according to an example embodiment.

FIG. 1C is a diagram 1000 of a modified version of the touch display 110 of FIG. 1B illustrating removal of the external ports along the periphery of the display's PCB, according to an example embodiment. The circles 1000-1 corresponding to the previous locations of the external peripheral connections 100B-1 but are removed completely with the teachings presented herein for devices 110.

Figure 1D:
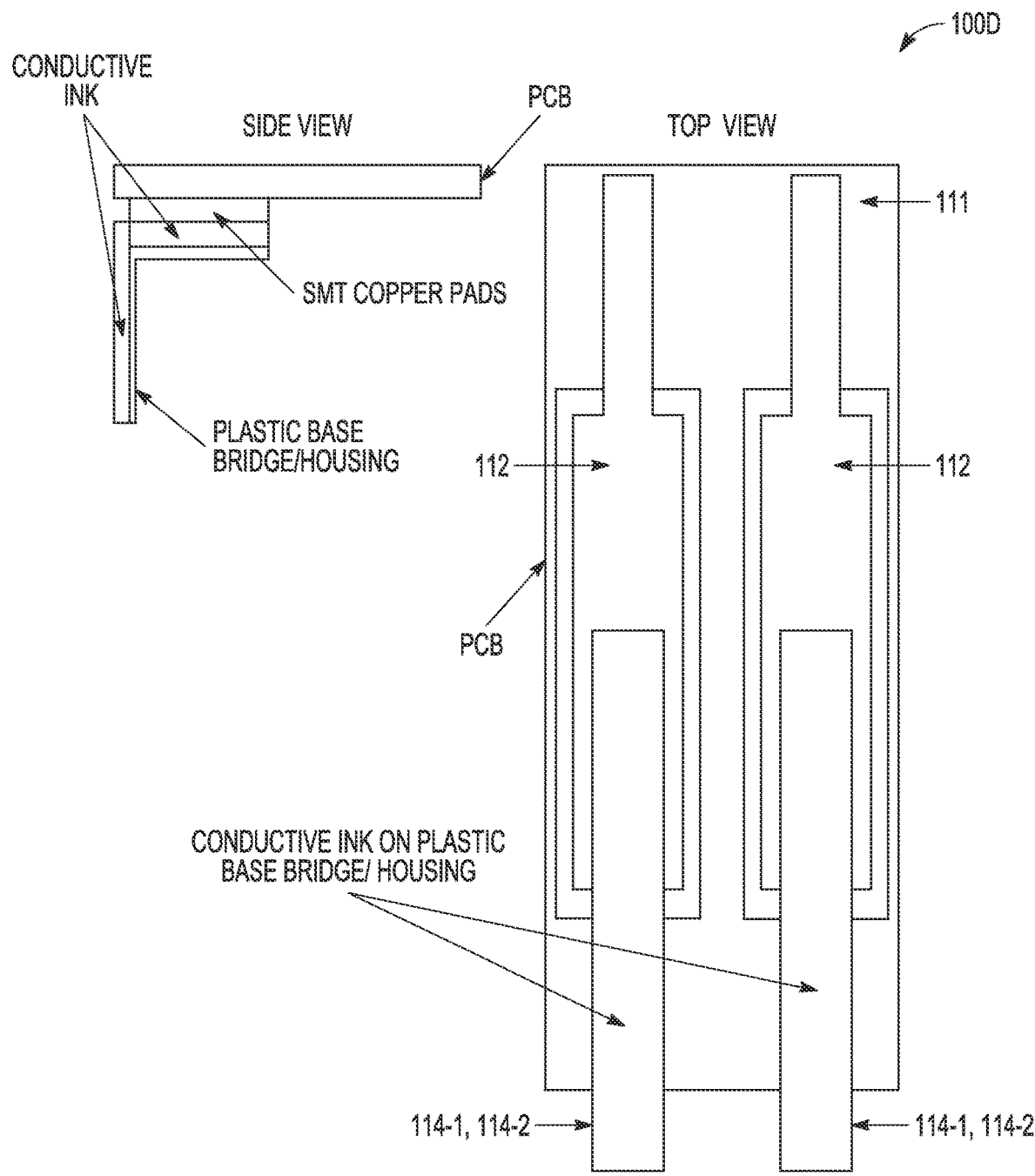
FIG. 1D is a diagram of a surface mount conductive pad manufactured in place of external port connectors on the device's PCB, according to an example embodiment.

FIG. 1D is a diagram 100D of a surface mount conductive pad 112 manufactured in place of external port connectors on the device's PCB, according to an example embodiment. A copper pad 112 or copper-based alloy pad 112 is surface mount conductive pads on the PCB in the location of an existing external peripheral port connection that is being removed and replaced with a new external peripheral port connection. In an embodiment, the pads 112 are copper that is mounted using surface-based technology (SBT) directly onto the PCB 111.

Conductive ink 114-1 is printed on top of the copper/copper-based alloy pads 112 and a plastic bridge base member 114-2 is 3D printed over the conductive ink 114-1. The conductive ink 114-1 is also printed along a side of the plastic bridge base member 114-2. This replaces a conventional external port connection designed to receive a cable for a peripheral device connection with a conductive PCB surface set of pads 112, conductive ink 114-1, and a plastic bridge base member 114-2. The wires 113 may then be 3D printed with nanoparticle conductive ink on an opposing side of the plastic bridge base member 114-2 along a channel in the outer surface of the housing of device 110 to a desired peripheral connection point on the outer surface of the housing. At the desired location along the housing of device 110 another set of conductive ink 114-1 is printed and another plastic bridge base member 114-2 is printed with the terminating ends of the wires 113 printed on top of the plastic bridge base member 114-2 at the desired location to form the external port 114. A peripheral device 110 is then connected via the external port 114 by bringing into contact the peripheral's PCB surface mount pads 112 with the printed wires 113 of the host device 110 on the plastic bridge base member 114-2.

Figure 1E:
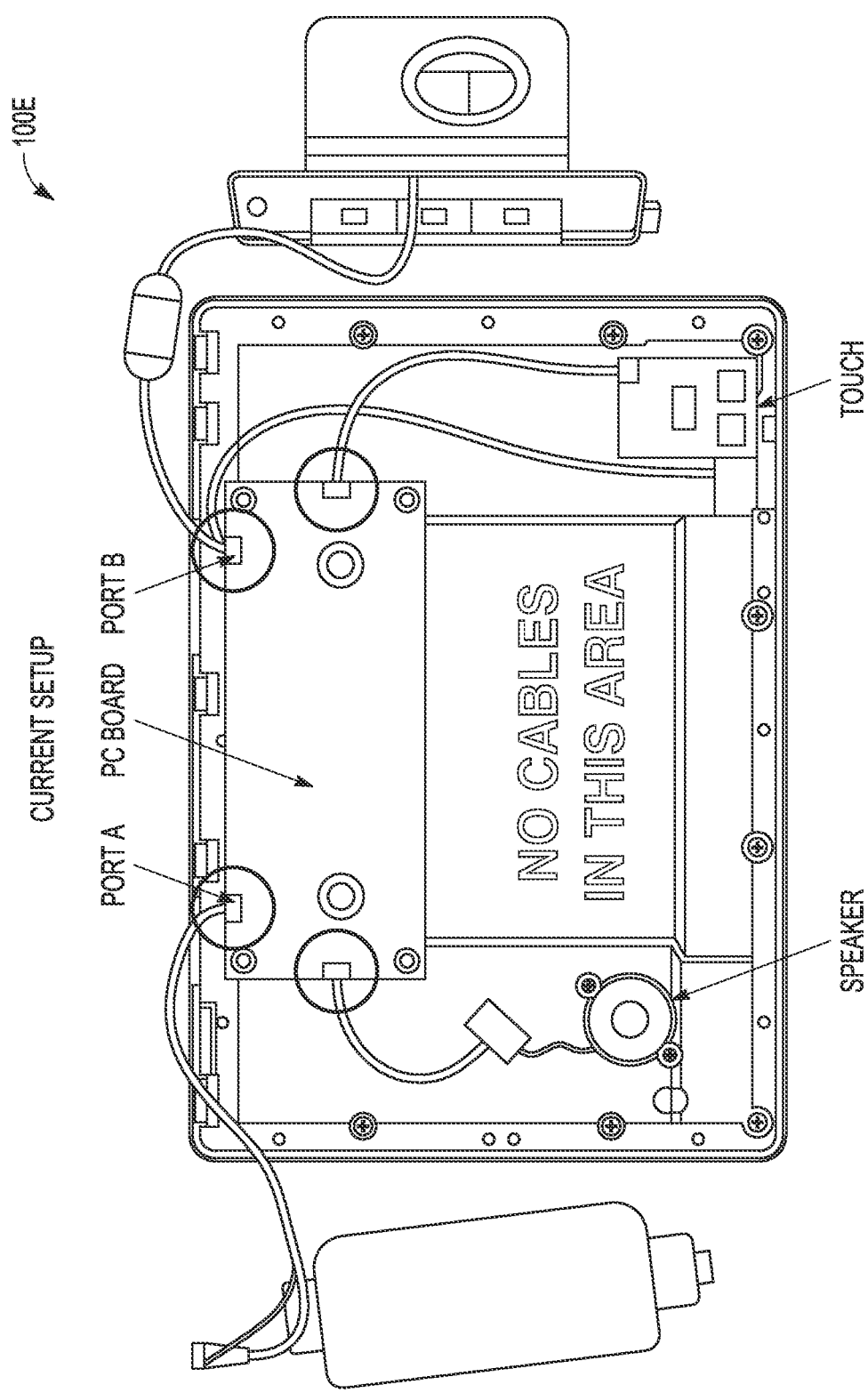
FIG. 1E is a prior art diagram illustrating the cable and port connections to a PCB board of the device of FIG. 1B, according to an example embodiment.

FIG. 1E is a prior art diagram 100E illustrating the cable and port connections to a PCB board of the touch display of FIG. 1B, according to an example embodiment. Diagram 100E illustrates a covered PCB, 4 port connections around the periphery of the PCB illustrated by the circles, a port A that is connected via a cable and port connector, a port B that is connected via a cable and a port connector, a speaker connected to a third port connection, and touch peripheral that is connected to a fourth peripheral. Notice the cables necessary for each peripheral associated with port A, port B, the speaker, and the touch peripheral. The speaker and touch peripheral cables and port connectors are hidden under the housing and exposed for viewing in diagram 100D.

Figure 1F:
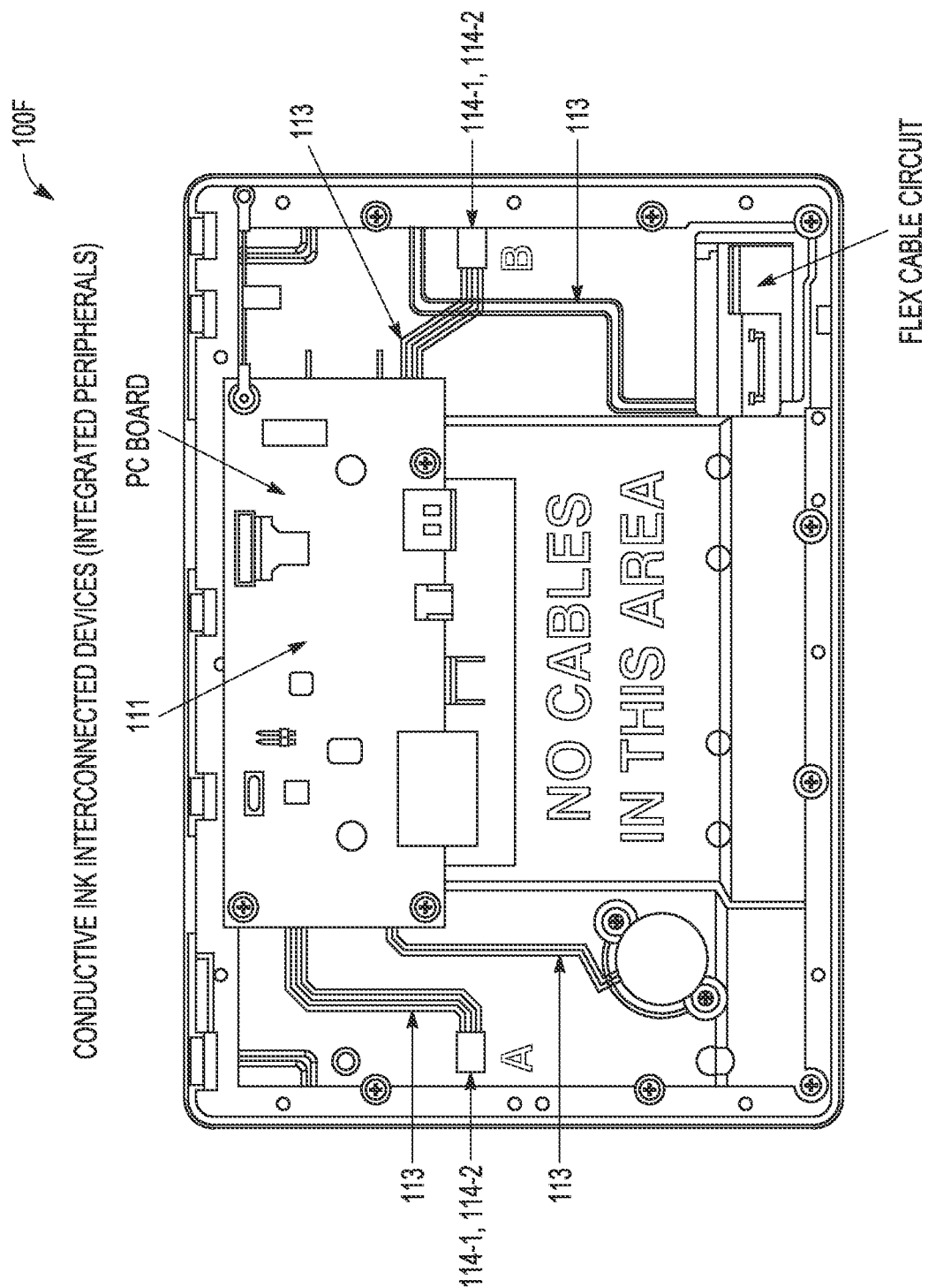
FIG. 1F is a diagram of a modified version of the device of FIG. 1E with 3D printed cables extending from the PCB surface mount external port pads to new locations along a housing of the modified device as next external ports, according to an example embodiment.

FIG. 1F is a diagram 100F of a modified version of the touch display 110 of FIG. 1E with 3D printed wires 113 extending from the PCB to new locations at external ports 114 along a housing of the modified touch display 110, according to an example embodiment. The cables illustrated in FIG. 1D are removed and the conductive wires 113 are 3D printed onto or under the outer housing. For example, the speaker wires 113 and the integrated flex circuit wires 113 for the touch display can be printed under the outer housing. The speaker wires 113 and/or the touch peripheral or flex circuit wires 113 can be located within canals of the housing cover. Port A and Port B have 3D printed wires 113 originating from corresponding PCB surface mount pads 112 the PCB 111 to external ports identified as 114-1 and 114-2 in diagram 100F. The wires 113 are printed on the housing cover in prefabricated canals or recesses of the housing cover. Access to the PCB surface mount pads 112 are made along a periphery of the touch display 110 and located in desired locations where contact-based external ports 114 are located via conductive ink 114-1 and the plastic bridge base members 114-2; this makes it easier to interface corresponding peripheral devices 110 that are to be connected to touch display 110.

Figure 1G:
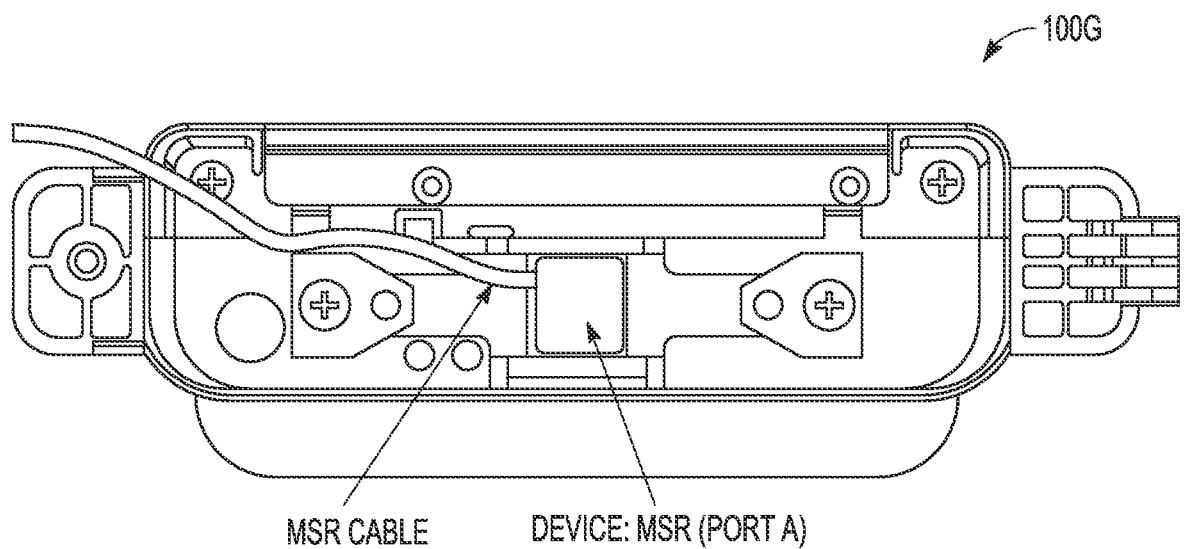
FIG. 1G is another prior art diagram illustrating a port connection to a device and the cables associated with a peripheral device's connection to the port, according to an example embodiment.

FIG. 1G is another prior art diagram 100G illustrating a port connection of a peripheral device and the cables associated with a peripheral device's connection to the port, according to an example embodiment. The port connection illustrated is for a magnetic stripe reader (MSR) peripheral device that is connected via cabling to a host touch display as shown in FIG. 1B or 1E. The MSR includes a port A, the MSR includes a port connector inserted into port A with cables that extend back to the PCB of the touch display host where the other end of cables are inserted into the MSR port connector on the PCB of the host display host.

Figure 1H:
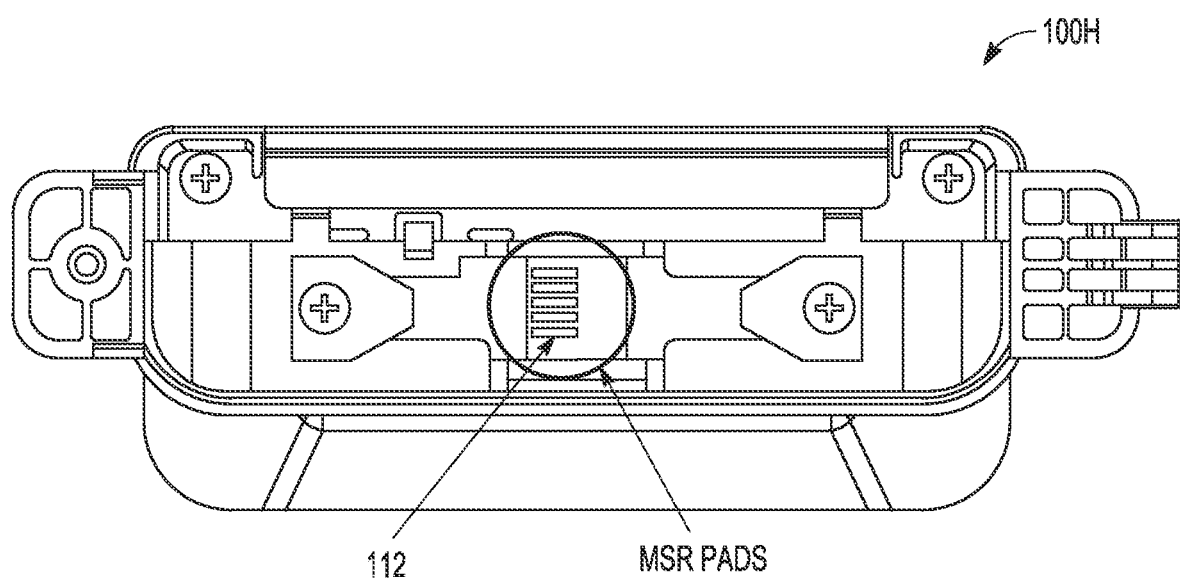
FIG. 1H is a diagram of a visually cableless conductive 3D PCB surface mount pad that replaces the port connection of the device shown in FIG. 1G, according to an example embodiment.

FIG. 1H is a diagram 100H of a cableless PCB surface mount conductive pad that replaces the port connection of the MSR device shown in FIG. 1G, according to an example embodiment. The MSR 110 and its corresponding conductive pads 112 for connecting to a touch display host 100 are illustrated in diagram 100F. Notice no cables and no port connectors are needed, only an exposed PCB surface mount pad 112 is needed to be placed in contact with corresponding conductive external port 114 of a touch display host 110 as shown in FIG. 1F. That is, for a peripheral device 110, such as MSR 110 in diagram 100H, the 3D printed wires 113 are unnecessary and just the conductive PCB surface mount pad 112 of MSR 110 can be fabricated on MSR 110; touch display host device 110 can include the external ports 114 when the MSR's PCB surface mount pads 112 are placed into contact with to establish a connection between the MSR's PCB 111 and the touch display host's PCB 111.

Figure 1I:
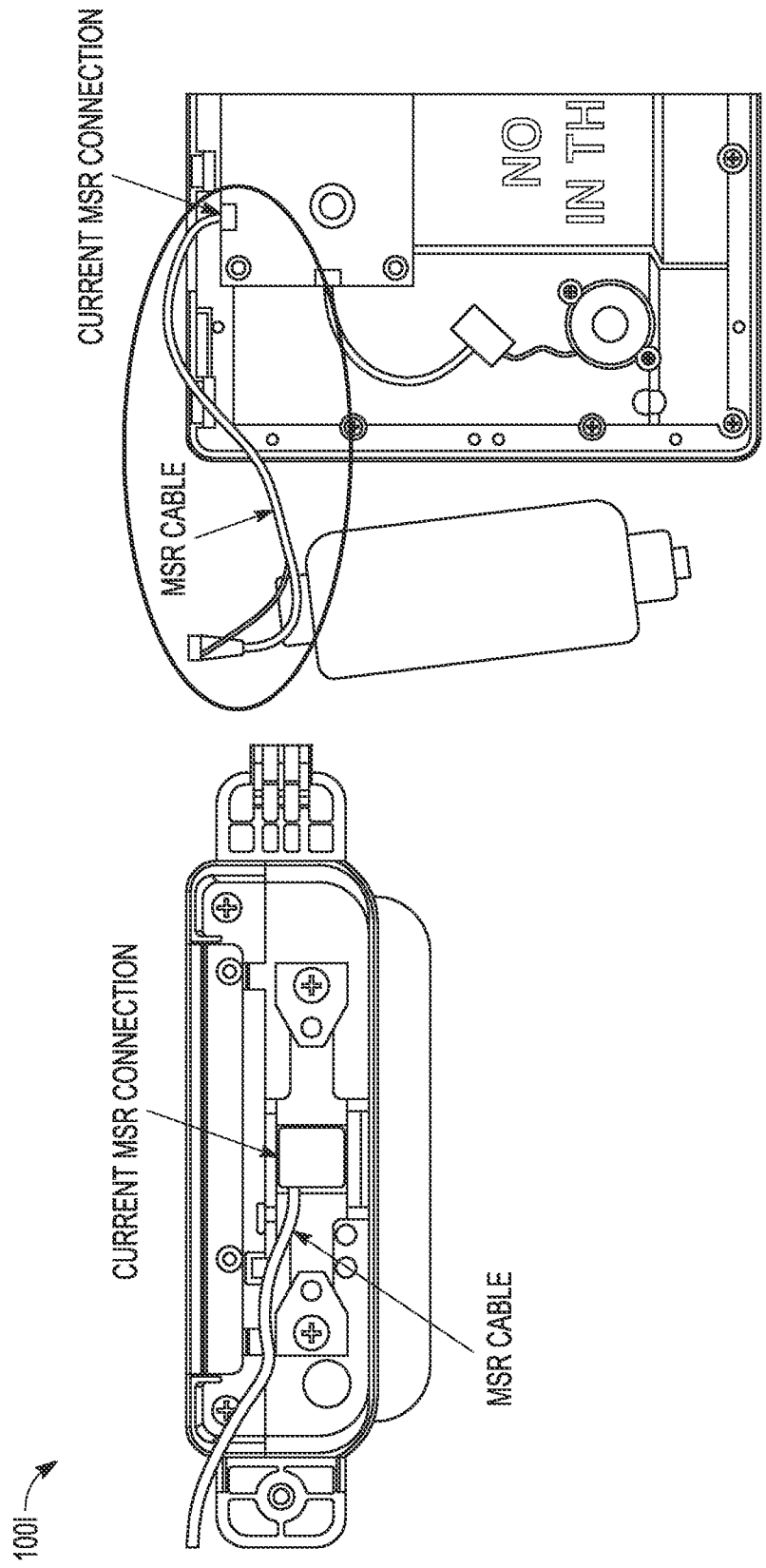
FIG. 1I are prior art diagrams of a device's exposed PCB, port connection, and cables associated with a peripheral connected port connected to the port connection on the PCB, according to an example embodiment.

FIG. 1I are prior art diagrams 100I of a device's exposed PCB, port connection, and cables associated with a peripheral connected port connected to the port connection on the PCB, according to an example embodiment Diagrams 100I illustrate a prior art MSR in the left diagram that is connected to a prior art touch display shown in the right diagram via port connections and cables using a conventional peripheral connection to a conventional host device. It is noted that the length of the cable has to be sized so that it is not too long so that it requires a cable cover or needs tucked away during set up of the touch display host. Yet, the cable length has to be long enough to reach the MSR where it will be positioned in relation to the touch display such that the cable can connect the PCB of the MSR to the PCB of the touch display host.

Figure 1J:
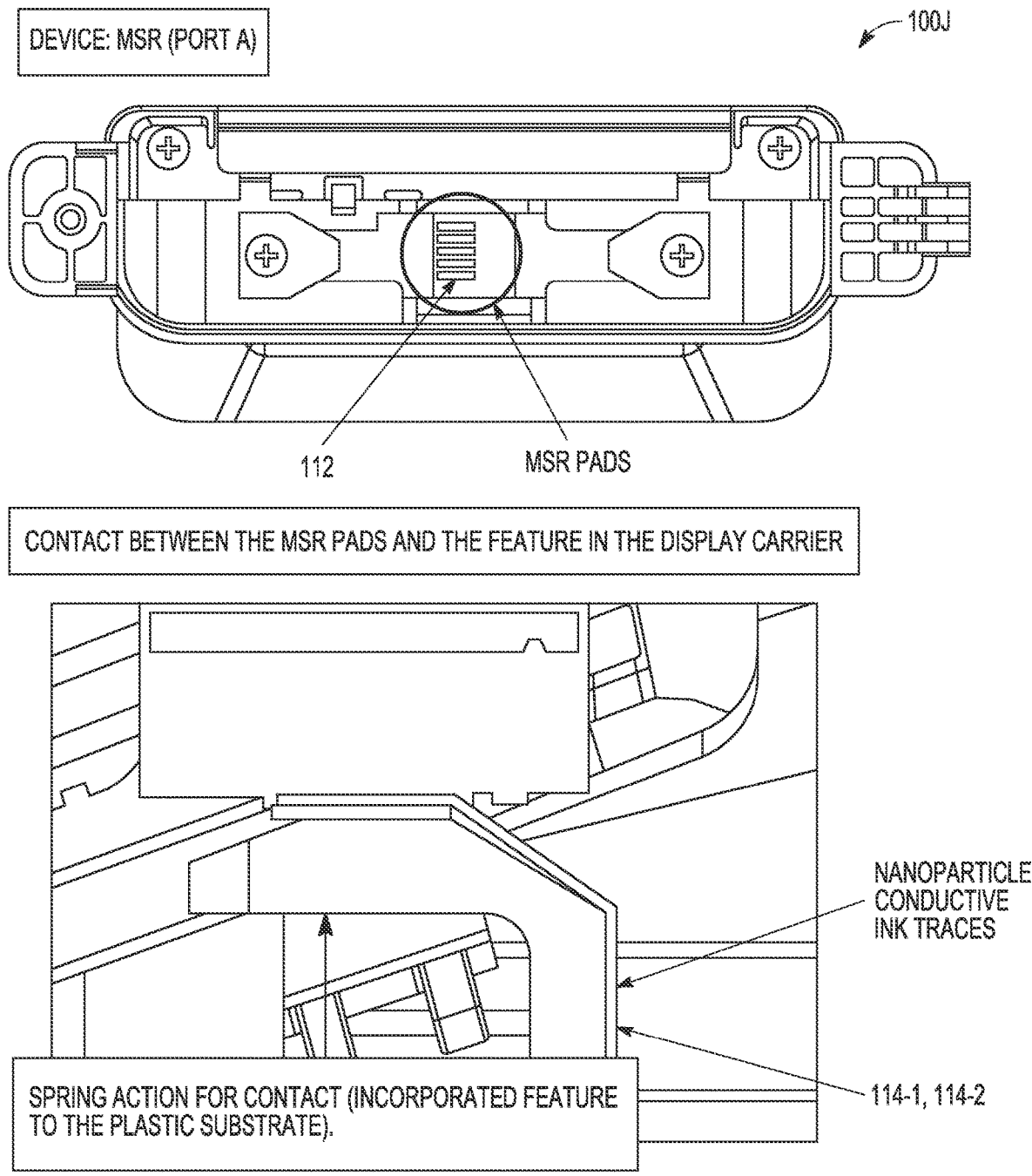
FIG. 1J are diagrams illustrating a new conductive ink pad that replaces the port connection for the device of FIG. 1I along with a plastic spring-based bridge printed under the pad, according to an example embodiment.

FIG. 1J are diagrams 100J illustrating a new conductive ink pad that replaces the port connection for the device of FIG. 1I along with a plastic spring-based bridge base member 142-2 printed under the wires 113 for the external port 114 on the host device 110, according to an example embodiment. The top leftmost diagram illustrates a new MSR peripheral 110 with exposed PCB surface pads 112 situated on a backside of the MSR 110. The bottom diagram illustrates a connection made between the MSR 110 and its pads 112 to an external port along the housing of a touch display host device 110. The exposed conductive pads 112 of the MSR 110 and touch display's corresponding external port 114 are aligned and the pads 112 of the MSR 110 rests or is pressed against the conductive ink 114-1, plastic bridge base member 114-2, and wires 113 of the touch display 110.

Figure 1K:
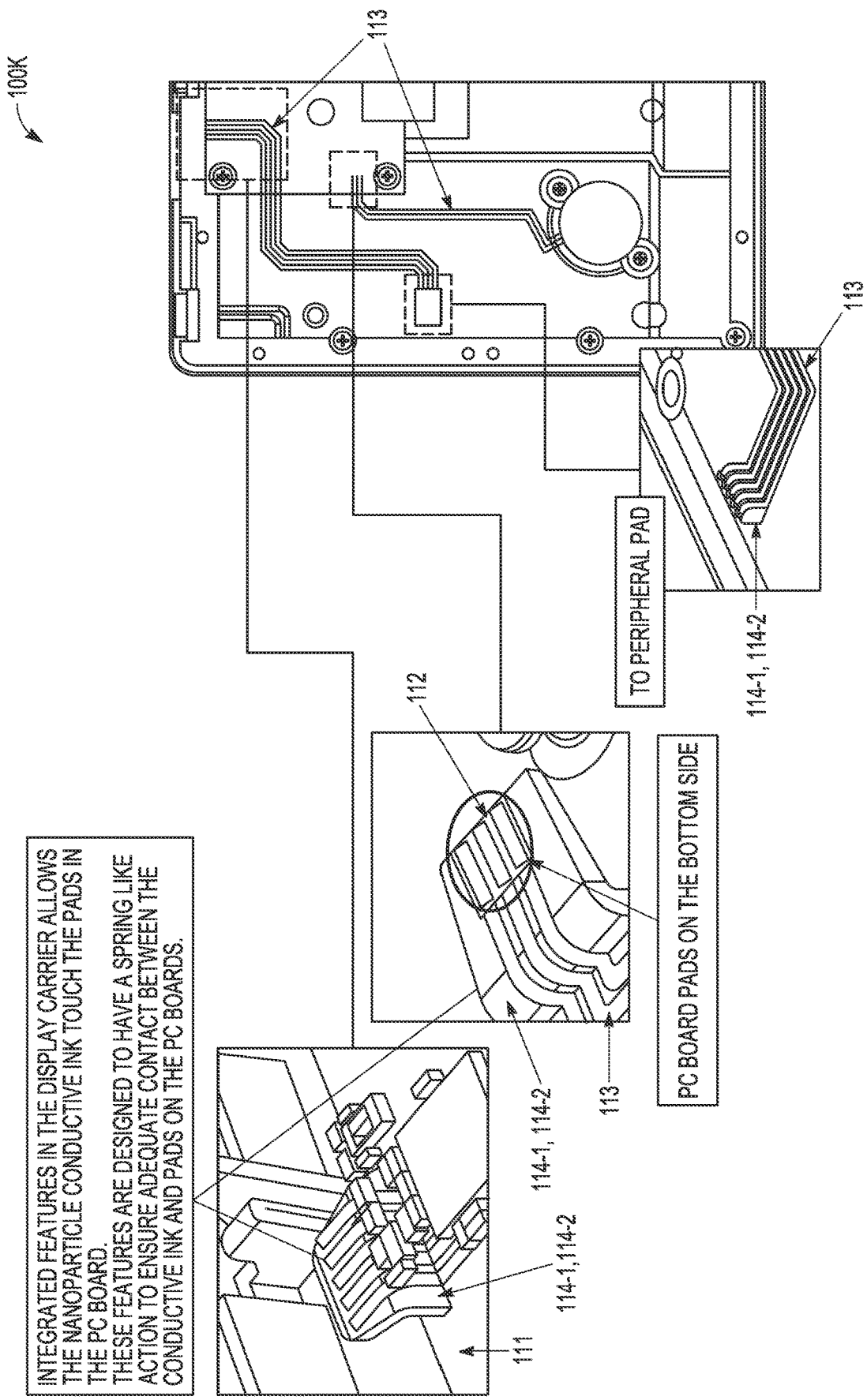
FIG. 1K are diagrams illustrating the printed conductive cables extending from the PCB surface mount pads to new external peripheral ports for a device, according to an example embodiment.

FIG. 1K are diagrams 100K illustrating the printed conductive wires 113 extending from the PCB surface mount pads 112 to new external ports 114 (114-1 and 114-2) that are new peripheral port connections for a device, according to an example embodiment. Diagrams 100K illustrate the spring-based connection of plastic bridge 114-2, which is situated on top the conductive pads 112 on the PCB 111 and which is situated under the wires 113 at the external ports 114; illustrated in the second figure from the left (for the PCB 111) and by the third figure from left (for the external port 114).

In an embodiment, a 3D printed frame with an aperture for a latch may be fabricated around the external peripheral ports 114 on a host device 110 and a protruding hook printed on a frame around the pads 112 of a peripheral device 110. The frame around the pads 112 of the peripheral device 110 is then aligned with the aperture in the frame of the host device 110 and snapped together at the external port 114 for the host device 110.

In an embodiment, internally integrated peripherals can include printed conductive ink wires 113 from corresponding PCB surface mount pads 112 of the PCB board 111 of device 110 directly to the internally integrated peripheral 110 in the case of a speaker peripheral, or directly to PCB surface mount pads 112 on a peripheral PCB 111 of the internally integrated peripheral 110 in the case of a touch-display peripheral. The corresponding printed wires 113 connection the PCB pads 112 of both the host 110 and the peripheral 110 can be under the housing from the host device 110.

Figure 2:
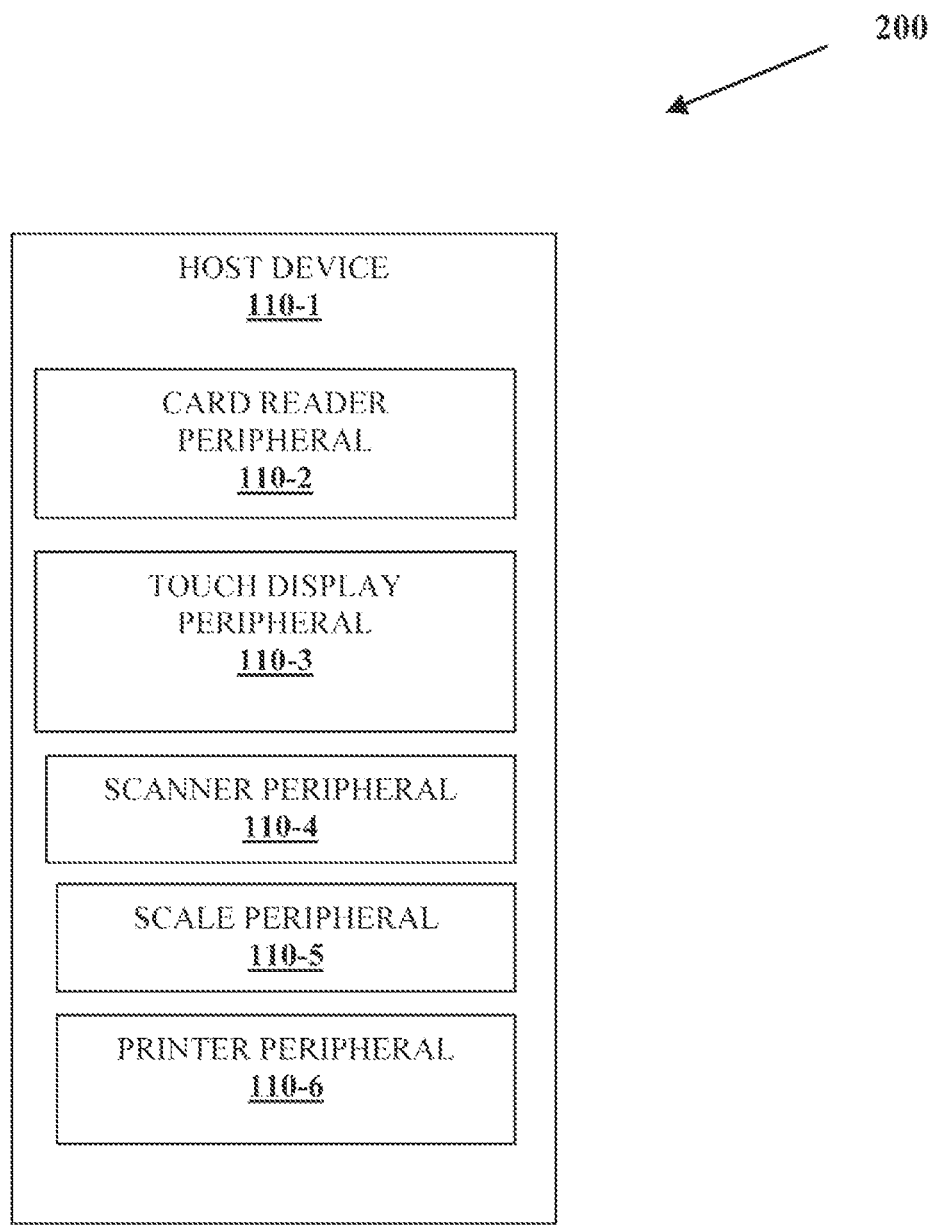
FIG. 2 is a diagram of a system that includes peripherals connected to a host device via PCB surface mount pads, 3D printed wires, and new external ports, according to an example embodiment.

FIG. 2 is a diagram of a system 200 that includes peripherals connected to a host device via PCB surface mount pads, according to an example embodiment. The system 200 includes a host device 110-1, a card reader peripheral 110-2, a touch display peripheral 110-3, a scanner peripheral 110-4, a scale peripheral 110-5, and a receipt printer peripheral 110-6.

The PCB 111 of the host device 110-1 is manufactured or modified after manufacture to include PCB surface mount conductive pads 112, 3D printed conductive wires 113 that extend from the conductive pads 112 to a new external port 114 located on a housing of the host device 110-1. The wires 113 and external port connection points are printed on an outer housing cover of the host device 110-1 in canals or recesses of the cover.

Each peripheral 110-2 to 110-6 similarly includes the PCB surface mount pads 112 exposed outside a housing form their PCBs 111 as illustrated in FIG. 1H. Each peripheral pad 113 is aligned and brought into contact with a corresponding external port 114 of the host device 110-1, the external port 114 includes a 3D printed plastic bridge base member 114-2, conductive ink 114-1, and the corresponding wires 113 that extend from the external port to the host's PCB surface mount pads 112. The physical contact between a given peripheral's pad 112 with the corresponding external port 114 of the host device 110-1 can be maintained via the spring-based action of the plastic bridge base members 114-2 for the peripheral's pads 112 and the external port 114. In an embodiment, the physical contact between a given peripheral's pad 112 with the corresponding external port 114 of the host device 110-1 can be maintained via a prefabricated latch, magnets, and/or based on their arrangements such that the force of gravity is used to maintain the physical contact when a peripheral 110-2 to 110-6 is placed on top of or hung from the side of the host device 110-1.

System 200 requires no cables, cable harnesses, nor port connectors. The pads 112 of the peripherals 110-2 to 110-6 are aligned and brought into contact with corresponding pads 112 of the host device 110-1 or with external ports 114 such that when system 200 is powered on, the system is operational with the host device 110-1 having electronic connections with each of the peripherals 110-2 to 110-6.

In an embodiment, the host device 110-1 is a touch display host device 110 as discussed above. In this embodiment, the touch display peripheral 110-3 is integrated within the host device 110-1 via 3D printed internal wires 113 located under the housing between the PCB 111 and the flex circuit as shown in FIG. 1F.

In an embodiment, the host device 110-1 includes just one peripheral. In an embodiment, the host device 110-1 includes two peripherals. In an embodiment, the host device 110-1 includes more than two peripherals.

In an embodiment, the host device 110-1 is a transaction terminal. In an embodiment, the transaction terminal is a self-service terminal (SST), a point-of-sale (POS) terminal, an automated teller machine (ATM), a reservation kiosk, a fuel kiosk, a travel-related kiosk, an entertainment-related kiosk, or an informational kiosk.

Figure 3:
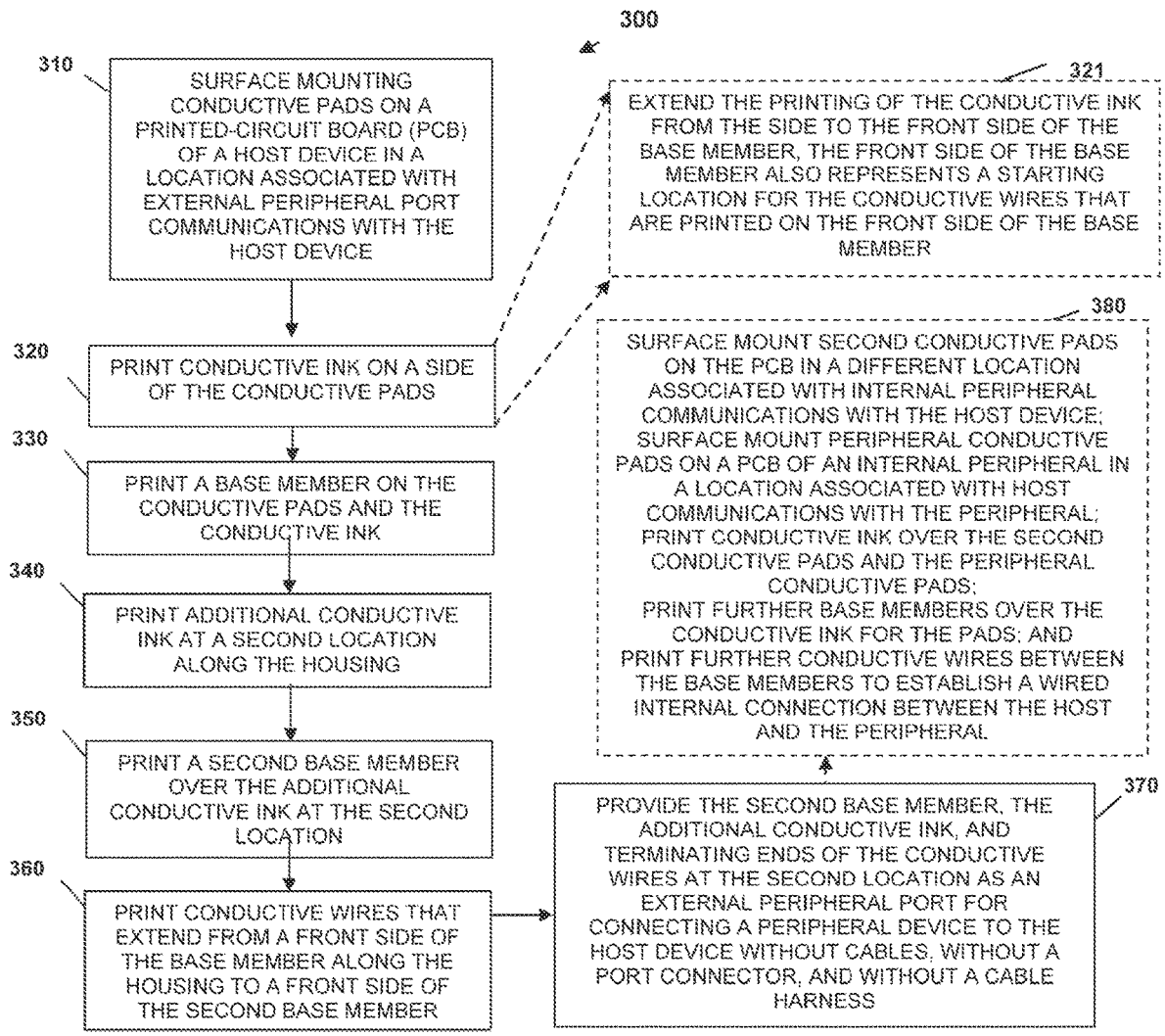
FIG. 3 is a flow diagram of a method for manufacturing a conductive ink 3D printed peripheral with PCB surface mount conductive pads, according to an example embodiment.

FIG. 3 is a flow diagram of a method 300 for manufacturing a conductive ink 3D printed peripheral with PCB surface mount conductive pads, according to an example embodiment. The method 300 is implemented as executable instructions referred to herein as "executable instructions." The instructions are executed by processors of a 3D printer and surface mount technology (SMT) devices, which cause the processors to perform operations discussed with method 300. The instructions reside in non-transitory computer-readable storage media or memory of the 3D printer 100 and the SMT devices.

At 310, the instructions causes SMT devices to surface mount conductive pads 112 on a PCB 111 of a host device 110 in a location or locations associated with external peripheral port communications with the host device 110. This establishes the necessary hardware and electrically conductive connections between the PCB 111 and the pads 112.

At 320, the instructions cause a 3D printer to print conductive ink 142-1 on a side of the conductive pads 112. The pads 112 are directly surface mount conductive pads 112 on the PCB 113 a backside of the pads 112 include the printed conductive ink.

In an embodiment, at 321, the instructions cause the 3D printer to extend the printing of the conductive ink 142-1 from the side of the conductive pads 112 to a front side of a base member 142-2. The front side of the base member 142-2 also represents a starting location for printing the conductive wires 113 that are printed by the 3D printer on the front side of the base member 142-2.

At 330, the instructions cause the 3D printer to print the base member 142-2 on the conductive pads 112 and the conductive ink 142-1. That is, a plastic bridge base member 142-1 is printed over the conductive ink 142-1 and the conductive pads 112. This maintains an electrically conductive connection between the PCB 111 of the host device 111 and the base member 142-2.

At 340, the instructions cause the 3D printer to print additional conductive ink at a second location along the housing of the host device. This second location represents a new external port on the outer surface of the housing for connecting a peripheral device 110.

At 350, the instructions cause a second base member 142-2 to be printed over the additional conductive ink 142-1 at the second location. The instructions also causes the additional conductive ink 142-1 to extend to a front side of the second base member 142-2.

At 360, the instructions cause conductive wires 113 to be printed that extend from a front side of the base member 142-2 along the outer surface of the housing to a front side of the second base member 142-2. An electrically conductive connection is made between the second location and the location having the conductive pads 112 on the PCB 111 through the conductive ink 142-1 and the housing and wires 113.

At 370, the instructions provide the second base member 142-2, the additional conductive ink, and terminating ends of the conductive wires 113 at the second location as an external peripheral port for connecting a peripheral device 110 to the host device 110 without cables, without a port connector, and without a cable harness. At least, the second base member 142-2 has spring-based characteristics such that when physical connections are made to a peripheral 110, the connections are maintained with one another.

In an embodiment, at 380, the instructions cause SMT devices to surface mount second conductive pads 112 on the PCB 111 in a different location associated with internal peripheral communications with the host device 110. The instructions also cause SMT devices to surface mount peripheral conductive pads 112 on a PCB 111 of an internal peripheral in a location associated with host communications with the peripheral. The instructions cause a 3D printer to print additional conductive ink 142-1 over the second conductive pads 112 and the peripheral conductive pads 112. The instructions further cause the 3D printer to print further base members 142-2 over the additional conductive ink 142-1 for the conductive pads 112. The instructions additionally cause the 3D printer to print further conductive wires 113 between the base members 142-2 to establish a wired internal connection between the host 110 and the peripheral 1110 without cables, without port connectors, and without any cable harnesses.

In an embodiment, at 311, the firmware causes the 3D printer to print a conductive plastic bridge base member 114 at the terminating location on the outer surface of the housing before printing a first nanoparticle ink wire 112. Each 3D nanoparticle ink wire 112 is printed on top of the conductive bride base member 114 at the terminating location. This was illustrated in FIGS. 1I and 1J above.

At 320, the firmware causes the 3D printer to iterate and repeat 310 for a next 3D nanoparticle ink wire 112 for a next pin connection on the PCB 111 until a set of pin connections for an external peripheral connection to the device 110 includes a corresponding 3D nanoparticle ink wire 112 at the terminating location. Each pin connection on the PCB 111 includes its own printed wire 112 to the terminating location on the outer surface of the housing for the device 110.

At 330, the firmware causes the 3D printer to print a 3D conductive pad 113 on top of each 3D nanoparticle ink wire 112 at the terminating location on the outer surface of the housing from the device 110. Each wire 112 includes its own unique conductive and contact-based pad 113.

In an embodiment, at 340, the firmware cause the 3D printer to print a second set of 3D nanoparticle ink wires 113 that corresponds to a second set of pin connections of the PCB 111 under the housing to internal peripheral pin connections of a peripheral PCB 111 for an internally integrated peripheral 110 of the device 110. That is, for internally integrated peripheral there does not need to be 3D conductive pads since it can be a PCB-to-PCB 3D nanoparticle ink wire printed for the internal peripheral connection between the device 110 and the peripheral 110. Moreover, for internally integrated peripherals that do not include a PCB, such as a speaker, the PCB 111 of the device 110 can include a printed wire 112 from the corresponding pin connections on the PCB 111 directly to the speaker.

It should be appreciated that where software/firmware is described in a particular form (such as a component or module) this is merely to aid understanding and is not intended to limit how software/firmware that implements those functions may be architected or structured. For example, modules are illustrated as separate modules, but may be implemented as homogenous code, as individual components, some, but not all of these modules may be combined, or the functions may be implemented in software/firmware structured in any other convenient manner.

Furthermore, although the software/firmware modules are illustrated as executing on one piece of hardware, the software/firmware may be distributed over multiple processors or in any other convenient manner. The above description is illustrative, and not restrictive. Many other embodiments will be apparent to those of ordinary skill in the art upon reviewing the above description. The scope of embodiments should therefore be determined with reference to the appended claims, along with the full scope of equivalents to which such claims are entitled.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus, the following claims are hereby incorporated into the Description of the Embodiments, with each claim standing on its own as a separate exemplary embodiment.

The invention claimed is:

1. A device, comprising:
   a printed circuit board (PCB);
   surface mount conductive pads on the PCB in a location associated with external peripheral communications for an external peripheral to the device;
   three-dimensional (3D) nanoparticle ink wires printed from the conductive pads along a housing of the device to a terminating location on the housing; and
   wherein the 3D nanoparticle ink wires that are associated with the terminating location are adapted when pressed against peripheral pads for the external peripheral to establish a wired connection between the device and the external peripheral without any cable, without any cable harness, and without any port connector.

2. The device of claim 1, wherein each a backside of the conductive pads include conductive ink.

3. The device of claim 2, wherein a plastic base member is printed over the conductive ink and the conductive pads.

4. The device of claim 3, wherein further conductive ink extends to a front side of the plastic base member, and wherein the 3D nanoparticle ink wires begin on the front side of the plastic base member.

5. The device of claim 4 further comprising, additional conductive ink on the housing at the terminating location with a second plastic base member printed on top of the additional conductive ink at the terminating location and the additional conductive ink extending to a front side of the second plastic base member.

6. The device of claim 5, wherein terminating ends of the 3D nanoparticle ink wires at the terminating location are printed on the front side of the second plastic base member.

7. The device of claim 1 further comprising:
   an integrated peripheral PCB for an integrated peripheral of the device;
   peripheral surface mount conductive pads on the integrated peripheral PCB in a location associated with host device communications with the device;
   second surface mount conductive pads on the PCB of the device in a second location associated with integrated peripheral communications; and
   second 3D nanoparticle ink wires printed from the second conductive pads of the PCB for the device under the housing to the peripheral conductive pads;
   wherein the second surface mount conductive pads, the peripheral surface mount conductive pads, and the second 3D nanoparticle ink wires provide an internal connection for the integrated peripheral communications and the host device communications between the device and the integrated peripheral without any cable, without any port connector, and without any cable harness.

8. The device of claim 1, wherein an outer surface of the housing includes a recessed canal fabricated in the housing where the 3D nanoparticle ink wires are printed on the outer surface of the housing within the recessed canal.

9. The device of claim 1, wherein the device is a touch display transaction terminal, and the external peripheral is a card reader.

10. A system, comprising:
a host device comprises:
   a host printed circuit board (PCB);
   surface mount conductive pads on locations of the PCB associated with peripheral communications for an external peripheral device; and
   three-dimensional (3D) nanoparticle ink wires printed from the surface mount conductive pads of the host PCB to a terminating location along a host housing of the host device, wherein the terminating location of the 3D nanoparticle ink wires represents an external port for the external peripheral device to connect with the host device; and
the external peripheral device comprises:
   peripheral surface mount conductive pads on a peripheral PCB in locations associated with host device communications for the host device;
   wherein the host device and the external peripheral device establish a wired connection to one another when the surface mount conductive pads of the host device are pressed against and contact the peripheral surface mount conductive pads without any cable, without any cable harness, and without any port connector.

11. The system of claim 10, wherein the host device comprises one or more additional sets of surface mount conductive pads on different locations of the host PCB, each additional set of conductive pads associated with an additional peripheral device.

12. The system of claim 10, wherein the host device comprises an additional surface mount conductive pads surface on different locations of the host PCB and additional 3D nanoparticle ink wires are printed from the additional conductive pads under the housing to touch-based surface mount conductive pads on a touch-based PCB for an integrated touch-display peripheral of the host device.

13. The system of claim 10, wherein the host device comprises additional surface mount conductive pads on different locations of the host PCB and additional 3D nanoparticle ink wires are printed from the additional conductive pads under the housing to speaker-based surface mount conductive pads on a speaker PCB for an integrated speaker peripheral of the host device.

14. The system of claim 10, wherein the host device is a touch display transaction terminal, and the external peripheral device is a card reader.

15. The system of claim 14, wherein the touch display transaction terminal is an automated teller machine (ATM), a self-service terminal (SST), a point-of-sale (POS) terminal, a fuel kiosk, a reservation kiosk, an entertainment kiosk, a travel kiosk, or an informational kiosk.

16. The system of claim 10, wherein the conductive pads are made of copper or include copper alloys.

17. The system of claim 10, wherein an outer surface of the peripheral housing includes the peripheral conductive pads exposed for placing in contact with the 3D nanoparticle ink wires at the terminating location on the housing.

18. A method, comprising:
   surface mounting conductive pads on a printed-circuit board (PCB) of a host device in a location associated with external peripheral port communications with the host device,
   printing conductive ink on a side of the conductive pads;
   printing a base member over the conductive pads and the conductive ink;
   printing additional conductive ink at a second location along the housing;
   printing a second base member over the additional conductive ink at the second location;
   printing conductive wires that extend from a front side of the base member along the housing to a front side of the second base member; and
   providing the second base member, the additional conductive ink, and terminating ends of the conductive wires at the second location as an external peripheral port for connecting a peripheral device to the host device without cables, without a port connector, and without a cable harness.

19. The method of claim 18, wherein printing the base member further includes extending the the printing of the conductive ink from the side to the front side of the base member, wherein the front side of the base member also represents a starting location for the conductive wires that are printed on the front side of the base member.

20. The method of claim 18 further comprising:
   surface mounting second conductive pads on the PCB of a host device in a different location associated with internally integrated peripheral port communications with the host device;
   surface mounting peripheral conductive pads on a peripheral PCB of an internally integrated peripheral in a location associated with host communications with the internally integrated peripheral;
   printing further conductive ink over the second conductive pads and the peripheral conductive pads;
   printing further base members over the further conductive ink for the second conductive pads and the peripheral conductive pads;
   printing further conductive wires that extend between the further base members under the housing to establish a wired internal connection between the host device and the internally integrated peripheral.

* * * * *